(12) United States Patent
Tanaka

(10) Patent No.: US 7,333,180 B2
(45) Date of Patent: Feb. 19, 2008

(54) POSITIONING APPARATUS AND EXPOSURE APPARATUS USING THE SAME

(75) Inventor: Hideo Tanaka, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 229 days.

(21) Appl. No.: 11/056,287

(22) Filed: Feb. 14, 2005

(65) Prior Publication Data

US 2005/0200827 A1    Sep. 15, 2005

(30) Foreign Application Priority Data

Mar. 1, 2004    (JP)    ............................. 2004-056225

(51) Int. Cl.
  *G03B 27/58* (2006.01)
  *G03B 27/42* (2006.01)
  *H02K 41/00* (2006.01)

(52) U.S. Cl. ............................. 355/72; 355/53; 310/12

(58) Field of Classification Search ................. 355/72, 355/53, 75, 77; 318/135, 640; 310/12
See application file for complete search history.

(56) References Cited

U.S. PATENT DOCUMENTS

| 6,130,517 | A | * | 10/2000 | Yuan et al. .................. 318/640 |
| 6,262,797 | B1 | * | 7/2001 | Horikawa ..................... 355/53 |
| 6,570,645 | B2 | | 5/2003 | Korenaga et al. ............. 355/75 |
| 2001/0028446 | A1 | * | 10/2001 | Higashiki ..................... 355/52 |
| 2002/0145721 | A1 | | 10/2002 | Korenaga et al. ............. 355/75 |
| 2003/0040831 | A1 | | 2/2003 | Tanaka et al. ............... 700/121 |
| 2003/0053059 | A1 | | 3/2003 | Mishima et al. ............. 356/401 |
| 2003/0098966 | A1 | | 5/2003 | Korenaga et al. ............. 355/75 |

FOREIGN PATENT DOCUMENTS

JP    2000-106344    4/2000

* cited by examiner

*Primary Examiner*—Peter B. Kim
(74) *Attorney, Agent, or Firm*—Fitzpatrick, Cella, Harper & Scinto

(57) ABSTRACT

A positioning apparatus including a coarse motion stage, a first moving mechanism to move the coarse motion stage with a large stroke, a fine motion stage, and a second moving mechanism to move the fine motion stage with a small stroke relative to the coarse motion stage. In addition, at least two couplings transmit forces from the coarse motion stage to the fine motion stage, and the couplings apply the forces in the same direction from at least two sides of the fine motion stage.

13 Claims, 8 Drawing Sheets

FIG. 3A                    FIG. 3B
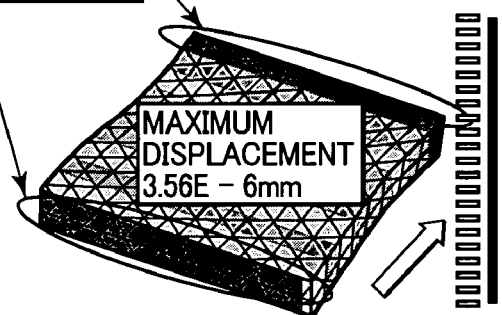
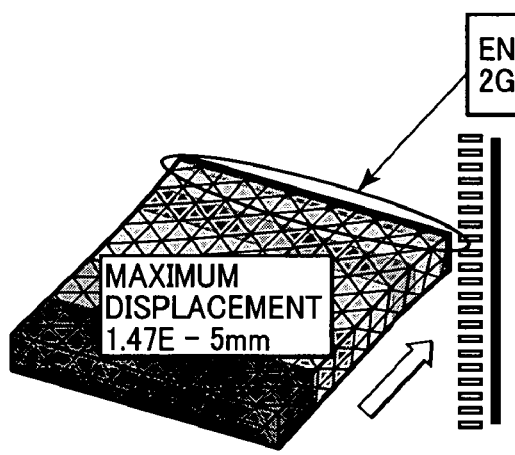
MAXIMUM
DISPLACEMENT    4.13
MAXIMUM
DISPLACEMENT    1

ELECTROMAGNETIC COUPLING ON THE SIDE OF
FINE MOTION TOP PLATE

ELECTROMAGNETIC COUPLING
ON THE SIDE OF COARSE MOTION
TOP PLATE

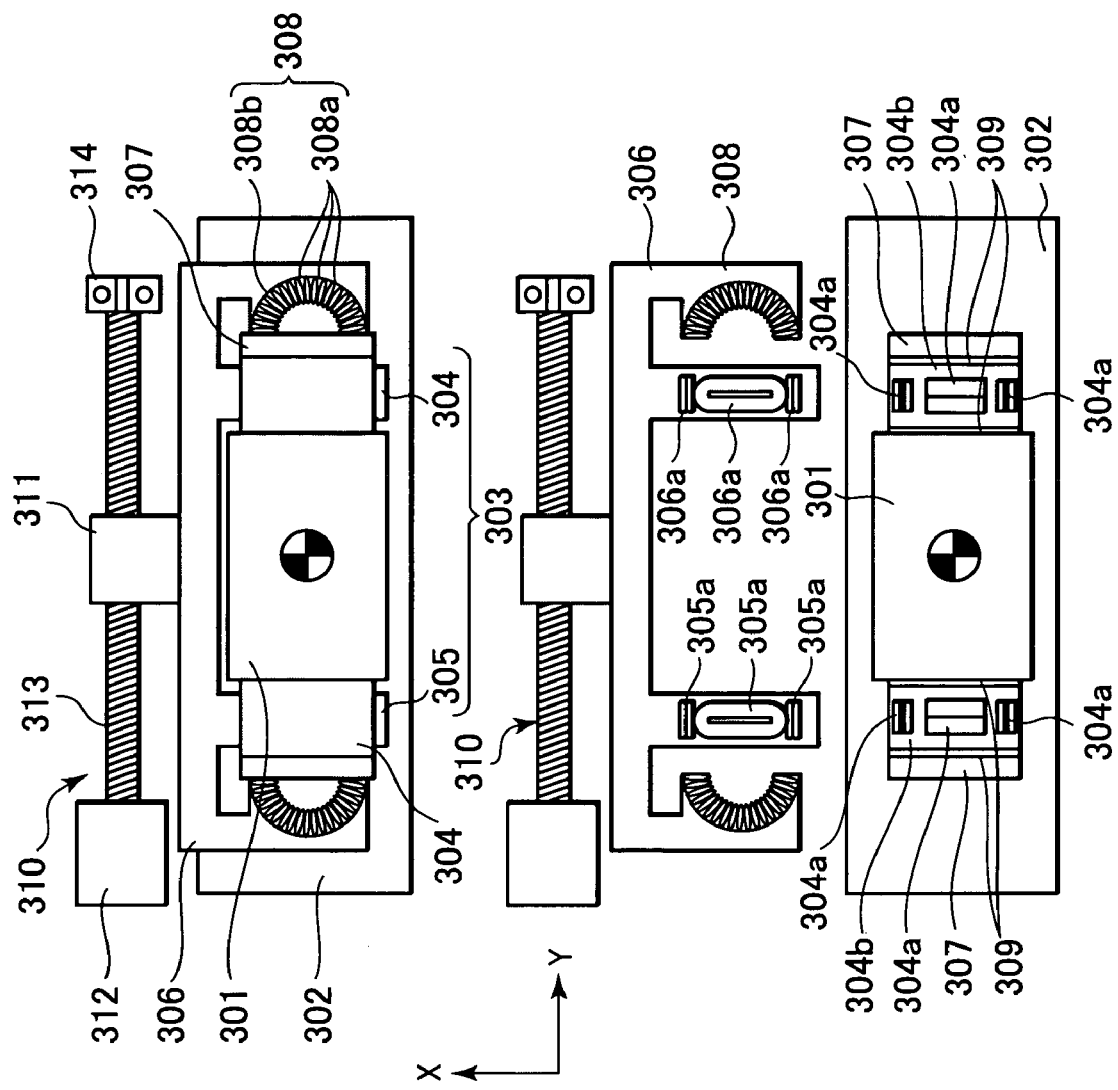

POSITIONING APPARATUS AND EXPOSURE APPARATUS USING THE SAME

BACKGROUND OF THE INVENTION

1. Field of the Invention

The present invention relates to a positioning apparatus and, more particularly, to a positioning apparatus for use preferably in an exposure apparatus used in manufacturing a semiconductor or liquid crystal device.

2. Description of the Related Art

An exposure apparatus for manufacturing a semiconductor or liquid crystal device has a reticle stage and a wafer stage for use in positioning a reticle (mask) as an original plate and a wafer as a substrate. "Ultraprecision Manufacturing Technology, Vol. 3: Technology of Measurement and Control" (the first edition, Jul. 15, 1995, issued by Fuji Technosystem, pp. 20-27, supervised by Akira Kobayashi) discloses a method of disposing a stage moving with a large stroke (coarse motion) and a stage moving with a small stroke (fine motion) to carry out high-precision positioning in this type of stage apparatus (positioning apparatus).

FIGS. 8A and 8B are diagrams showing a stage apparatus having a coarse and fine motion mechanism described in Japanese Laid-Open Patent Publication (Kokai) No. 2000-106344. A support frame 306 (coarse motion stage) connected to a movable section 311 of a feed screw system 310 moving with a large stroke is movable on a plane guide 302. The feed screw system also includes a feed screw 313 and a motor 312. The support frame 306 is provided with a linear motor stator 305 for moving with a small stroke and generates a force between the support frame 306 and a stage 301 (a fine motion stage) provided with a linear motor mover 304, thereby enabling the stage 301 to move finely relative to the support frame 306.

The support frame 306 is further provided with a pair of electromagnets 308 such that the stage 301 is put between the electromagnets 308 in a Y-axis direction. It generates an attraction between the pair of electromagnets 308 and a magnetic plate 307 provided on the stage 301, thereby functioning as an electromagnetic coupling. When the support frame 306 accelerates or decelerates at the maximum velocity, it transmits a force to the stage 301 by using an attraction of one of the pair of electromagnets 308.

SUMMARY OF THE INVENTION

While these technologies have fully satisfied the precision required in those days, in recent years a demand for a still higher precision is increasing on a positioning apparatus. More specifically, while the electromagnetic coupling transmits a force by the attraction in FIGS. 8A and 8B, pulling the stage with a strong force from one side in a single direction causes a problem of a deformation of the stage. This type of deformation can be a serious problem particularly in a stage apparatus for an exposure apparatus required to have a nanometer order position reproducibility.

To resolve the above problem, according to one aspect of the present invention, there is provided a positioning apparatus having a coarse motion stage moving with a large stroke, a fine motion stage (top plate) moving with a small stroke relative to the coarse motion stage, and at least two couplings for transmitting a force attendant on an acceleration or deceleration of the coarse motion stage to the fine motion stage, wherein the couplings apply forces from at least two sides of the fine motion stage at the acceleration or deceleration of the coarse motion stage.

According to the present invention, it is possible to provide a high-precision positioning apparatus permitting a reduction in the deformation of the fine motion stage attendant on the acceleration or deceleration of the coarse motion stage.

Further features and advantages of the present invention will become apparent from the following description of exemplary embodiments (with reference to the attached drawings).

BRIEF DESCRIPTION OF THE DRAWINGS

FIGS. 3A and 3B are diagrams showing an analysis result of deformations of a top plate.

FIGS. 8A and 8B are diagrams showing an example of a conventional arrangement.

DESCRIPTION OF THE EMBODIMENTS

First Embodiment

Figure 1:
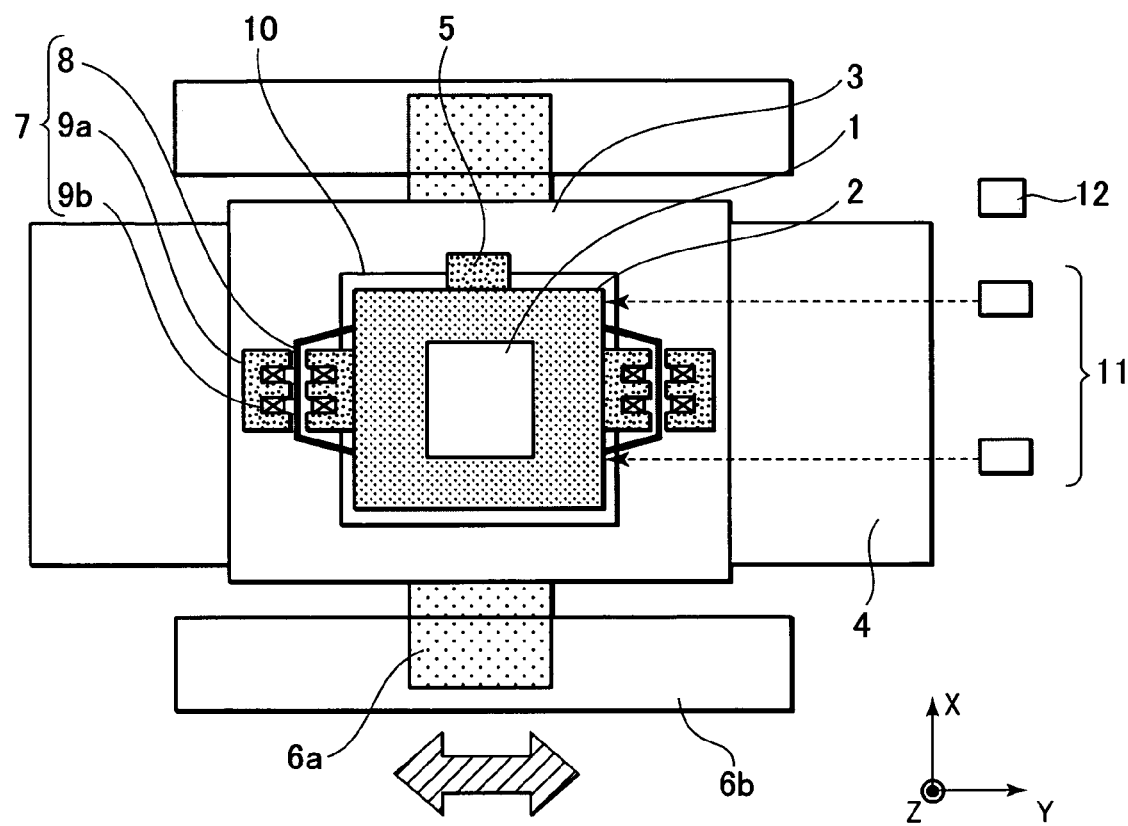
FIG. 1 is a reticle stage diagram according to the first embodiment.

Referring to FIG. 1, there is shown a diagram of a reticle stage according to the first embodiment. The reticle stage has a coarse motion stage 3 and a fine motion stage 2. The coarse motion stage 3 is supported movably on a top face of a surface plate 4 and is movable with a large stroke in a Y-axis direction as a scanning direction by means of a coarse motion linear motor 6. The coarse motion linear motor 6 has a stator 6a composed of a coil unit (not shown) supported by a base and a mover 6b composed of a magnetic unit fixed to the coarse motion stage 3. The coarse linear motor 6 generates a Lorentz force between the stator 6a and the mover 6b to drive the coarse motion stage 3. The mechanism for driving the coarse motion stage 3 is not limited to the linear motor, but can be any other driving mechanism.

The coarse motion stage 3 has an opening 10 for passing exposure light therethrough in a central region. The fine motion stage 2, having a reticle 1 mounted thereon, is disposed in the opening 10, with the fine motion stage 2 supported by a spring mechanism (not shown) with a low rigidity from the coarse motion stage 3. A fine motion linear motor 5 and electromagnetic couplings 7 are arranged between the fine motion stage 2 and the coarse motion stage 3. The fine motion linear motor 5 enables the fine motion stage 2 to move finely relative to the coarse motion stage 3. The fine motion linear motor 5 drives the fine motion stage 2 in a non-contact maimer by means of a Lorentz force between coils and magnets as described in the example of the conventional arrangement. Therefore, it is arranged so as to drive the fine motion stage 2 finely in three axial directions of an X direction, a Y (scanning) direction, and a Z (vertical) direction or so as to drive it finely in six axial directions further including directions around the X axis, the Y axis, and the Z axis. The number of axes or axial directions can be arbitrarily changed according to a required precision and a space or other design matter. Positions in the three axial directions or the six axial directions of the fine motion stage 2 are measured by a laser inter ferometer 11.

The electromagnetic coupling 7 has an electromagnet composed of an I core 8 (a magnetic plate 8) as a magnetic member disposed on the fine motion stage 2, an E core 9a as a magnetic member disposed on the coarse motion stage 3, and a coil 9b around the E core 9a. One of the features of this embodiment is that each of two magnetic plates 8 arranged in front of and behind the fine motion stage 2 in the Y-axis direction is provided with a pair of electromagnets 9 arranged on the coarse motion stage 3 such that each magnetic plate 8 is positioned between the electromagnets 9 in the Y-axis direction.

Figure 2:
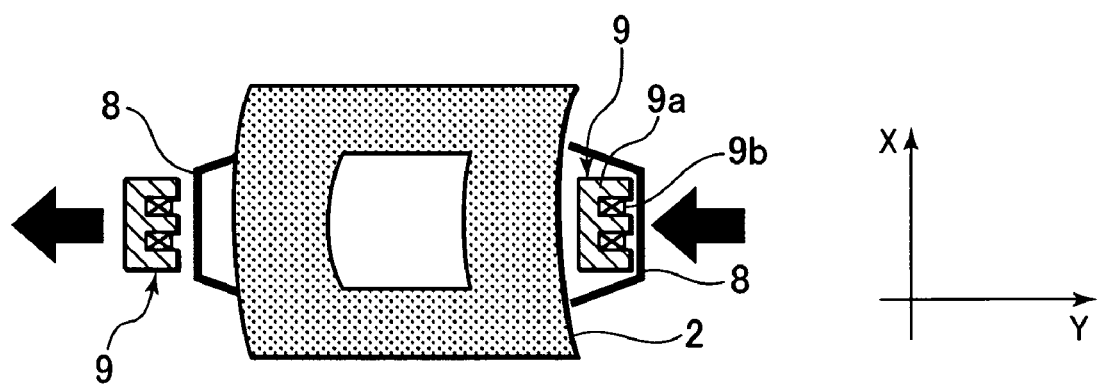
FIG. 2 is a diagram showing force transmission of electromagnetic couplings.

Referring to FIG. 2, there is shown a diagram for explaining a method of applying a force of the electromagnetic couplings 7 in this embodiment. FIG. 2 shows a situation of applying a force in a −Y direction to the fine motion stage 2 when the coarse motion stage 3 moves with an acceleration or deceleration in the −Y direction. In FIG. 2, the electromagnets not applying the force are not shown. The electromagnets 9 are disposed such that each magnetic plate 8 in front of and behind the fine motion stage 2 in the Y-axis direction is positioned between the electromagnets 9 and a force is applied to each magnetic plate 8 by means of the corresponding electromagnet generating an attraction in the −Y direction. By applying the force to each magnetic plate 8 disposed in front of and behind the fine motion stage 2 in this manner, the force can be applied from two sides of the fine motion stage 2, thereby reducing the deformation of the fine motion stage 2 attendant on the acceleration or deceleration of the coarse motion stage 3. In FIG. 2, there are shown only the electromagnets generating a force in the directions indicated by arrows, out of the electromagnets in FIG. 1.

The force applied by the electromagnetic coupling 7 is determined by calculating an inertial force meeting a mass or an accelerated velocity of the stage.

It is desirable to dispose the electromagnetic coupling such that it applies a force from sides of the fine motion stage (a face perpendicular to the Y-axis direction in this embodiment) and more desirable to have a line of action in the vicinity of a gravity point position of the fine motion stage, since these are effective to reduce unnecessary moments or deformations.

FIGS. 3A and 3B show an analysis result of deformations of the fine motion stage (top plate). The top plate used for this analysis has a form of a simplified fine motion stage. FIG. 3A shows an analysis of a magnitude of deformation of the top plate at applying a force equivalent to a 2G acceleration of the top plate only to one side of the top plate. FIG. 3B shows an analysis of a magnitude of deformation of the top plate at applying a force equivalent to a 2G acceleration of the top plate to both sides of the top plate. In these diagrams, the magnitude of deformation is indicated by shading. The highest magnitude of deformation in FIG. 3B is as low as in the order of one-fourth of that in FIG. 3A.

In this embodiment, the electromagnets are opposed to the respective magnetic plates disposed in front of and behind the fine motion stage and thereby an electromagnetic coil to be powered is selected. It is also possible, however, to make adjustments to decrease the magnitude of deformation of the fine motion stage and thereby an electromagnetic coil to be powered is selected. It is also possible, however, to make adjustments to decrease the magnitude of deformation of the fine motion stage by controlling a current distribution into the coils. This adjustment can be made in real time by using a deformation detecting means 12 for measuring other points on the fine motion stage. The deformation detecting means can be a laser interferometer or, for example, a strain gauge only if it can measure a magnitude of deformation of the fine motion stage. Instead of the magnitude of deformation, a magnitude of displacement of a reticle to the fine motion stage can be detected in real time to adjust a force applied to the fine motion stage in real time on the basis of the magnitude of deformation. If it is possible to predict the magnitude of deformation of the fine motion stage, it can be previously retained as data to correct the deformation on the basis of the data.

Figure 5A:
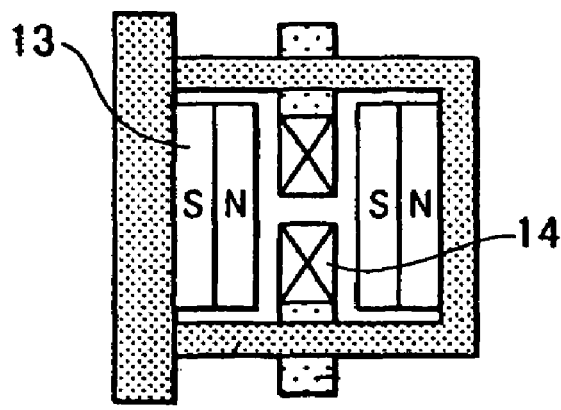
FIGS. 5A and 5B are diagrams showing a modification of an electromagnetic coupling.
Figure 5B:
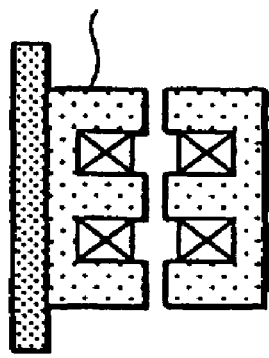

Besides the electromagnetic coupling having the E core and the I core stated above, there can be the following modification. FIG. 5 shows the modification of the electromagnetic coupling. FIG. 5A is a diagram showing an arrangement where both the coarse motion stage and the fine motion stage are each provided with an E core. The forces of attraction and repulsion can be selectively generated according to a direction of current applied to the coil around each E core. Referring to FIG. 5A, a coreless coil 14 on the coarse motion stage is disposed in a magnetic field formed by a permanent magnet 13 on the fine motion stage. The direction of a force applied by the magnetic field can be selected out of two directions according to a direction of current applied to the coreless coil 14. The permanent magnet is disposed on the side of the fine motion stage here to minimize a disturbance of a power cable or an effect of a coil heat due to the arrangement of the coil section on the side of the fine motion stage. The same is true in the embodiment having the E core and the I core.

While the electromagnetic actuator (electromagnetic coupling) has transmitted the force in this embodiment, there can be a structure in which an air actuator or an elastic member transmits the force. This structure permits a reduction in heat generation.

According to this embodiment, the coupling applies a force from at least two sides of the fine motion stage in the same direction (Y direction). Thereby, an effect of deformation can be reduced. These two sides are perpendicular to the Y direction.

According to this embodiment, the magnitude of deformation of the fine motion stage or the magnitude of displacement of the reticle and/or the plate relative to the fine motion stage is measured to adjust a force that the coupling applies to the fine motion stage on the basis of the measurement result. The force adjustment here includes not only a force distribution into the plurality of couplings, but also a change only in the magnitude of the force.

Second Embodiment

Figure 4:
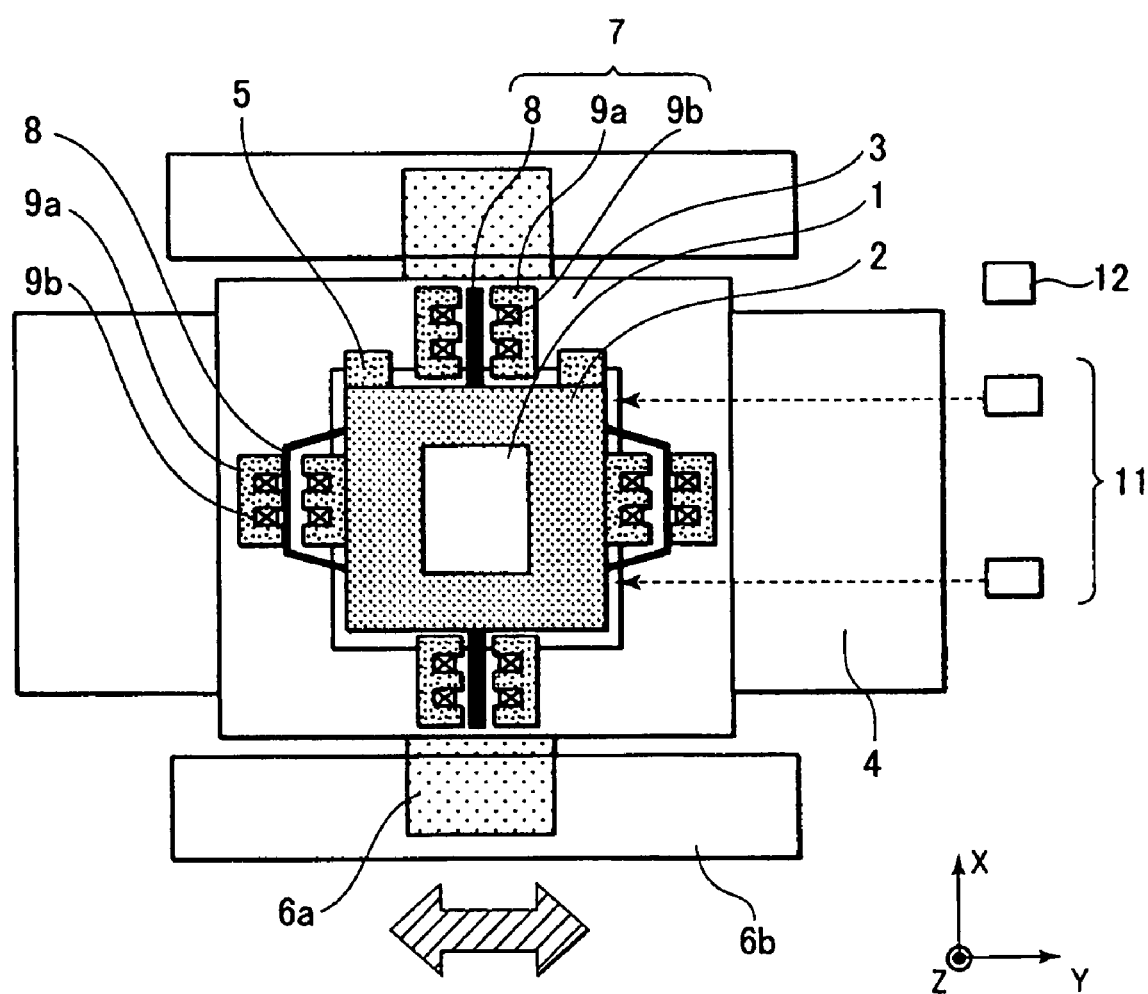
FIG. 4 is a diagram showing a reticle stage according to the second embodiment.

Referring to FIG. 4, there is shown a diagram of a reticle stage according to the second embodiment. The same reference numerals have been retained for similar elements which have the same functions as in FIG. 1 and their detailed description is omitted here. In the second embodiment, electromagnetic couplings 7 are disposed also in both sides of a fine motion stage in a direction perpendicular to a scanning direction. More specifically, magnetic plates 8 are disposed on two sides perpendicular to the Y axis of the fine motion stage and on two sides perpendicular to the X axis, and electromagnets 9 are disposed on the coarse motion stage such that each magnetic plate is positioned between the electromagnets in the Y-axis direction.

By disposing the plurality of electromagnetic couplings in this manner, the force applied to the fine motion stage 2 can be distributed, thereby reducing the deformation. While two electromagnetic couplings can be disposed on each side of the fine motion stage in the scanning direction regarding the locations of the electromagnetic couplings, the force can be further equalized by disposing the electromagnetic couplings on all sides of the fine motion stage. Furthermore, a adjustment can be made to reduce the deformation of the fine motion stage by controlling forces applied by the electromagnetic couplings. Although the adjustment method is similar to the first embodiment, more precise adjustment can be made in this embodiment due to an arrangement of the plurality of electromagnetic couplings.

Third Embodiment

Figure 6:
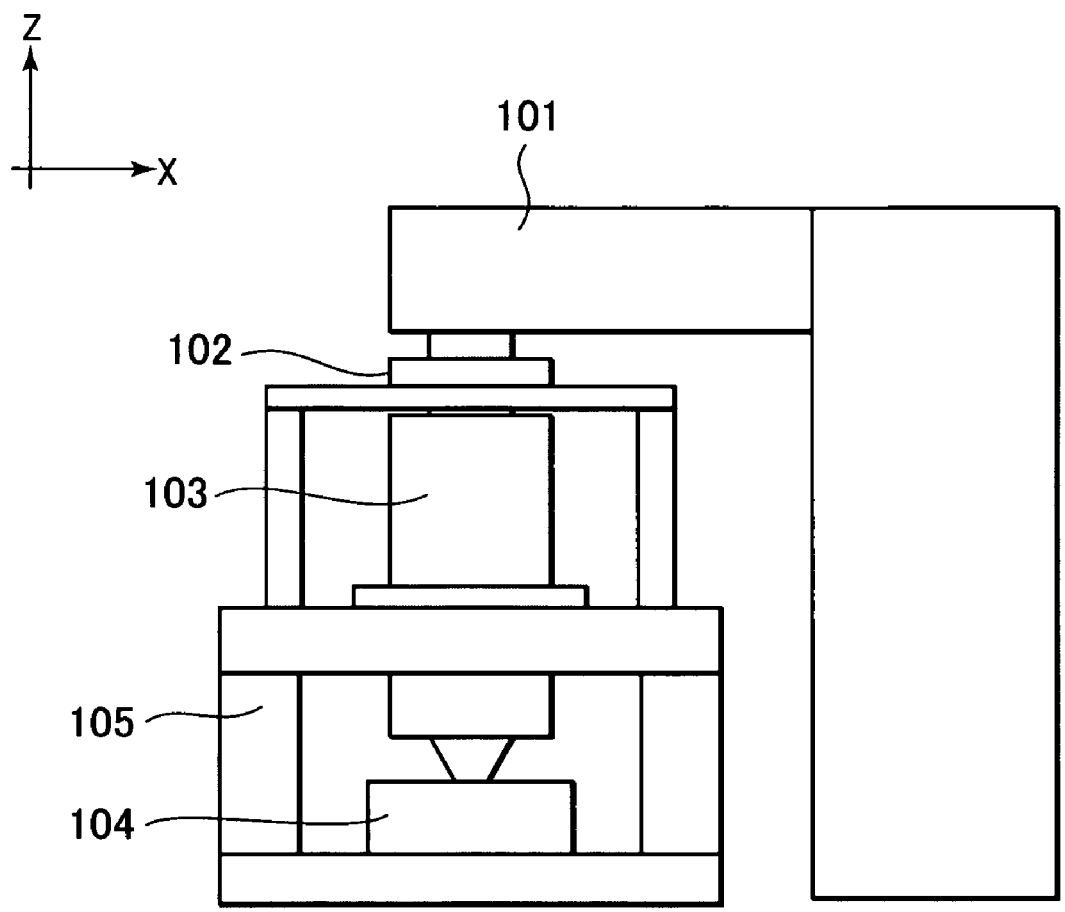
FIG. 6 is a diagram showing an exposure apparatus.

The positioning apparatuses according to the first and second embodiments are not limited to the reticle stages, but can be positioning apparatuses required to have a high precision. Therefore, while the above embodiments have been described by giving an example of an arrangement with a coarse motion in one axial direction in the scanning direction, a coarse motion can be made in two axial directions. Referring to FIG. 6, there is shown an exposure apparatus for manufacturing a semiconductor device on which the foregoing positioning apparatus is mounted as a reticle stage, a wafer stage, or both.

The exposure apparatus is for use in manufacturing a semiconductor device such as a semiconductor integrated circuit or a device having minute patterns such as a micromachine or a thin-film magnetic head. The exposure apparatus forms desired patterns on a substrate mounted on a wafer stage 104 by irradiating a semiconductor wafer W as the substrate via a reticle, which is an original plate, with an exposure light (the exposure light is a general term for visible light, ultraviolet radiation, extreme-ultraviolet (EUV) radiation, an X-ray, an electron beam, a charged particle beam, and the like) as exposure energy from a lighting unit 101 via a projection unit 103 (the projection unit is a general term for a refractive lens, a reflective lens, a catadioptric lens system, a charged particle lens, and the like) as a projection system.

A wafer (physical object) as a substrate is held on a chuck mounted on the wafer stage 104, and the lighting unit 101 transfers a pattern of a reticle as an original plate mounted on a reticle stage 102 in respective areas of the wafer in a step-and-repeat or step-and-scan system.

By applying the positioning apparatus according to the first embodiment or the second embodiment to this type of exposure apparatus, it becomes possible to provide an exposure apparatus capable of preventing deterioration in precision caused by an effect of the deformation of the fine motion stage (top plate) and thereby having a high precision and/or high throughput.

Furthermore, if the magnitude of deformation of the fine motion stage or the magnitude of displacement of the substrate relative to the fine motion stage detected in the first embodiment or the second embodiment exceeds a predetermined value, it is possible to halt the exposing work once to measure the magnitude of deformation of the fine motion stage again or a relative location of the substrate to the fine motion stage precisely with the fine motion stage stopped and to store the measured value as an offset value into a memory in a control system so that it can be reflected on the control.

Fourth Embodiment

Figure 7:
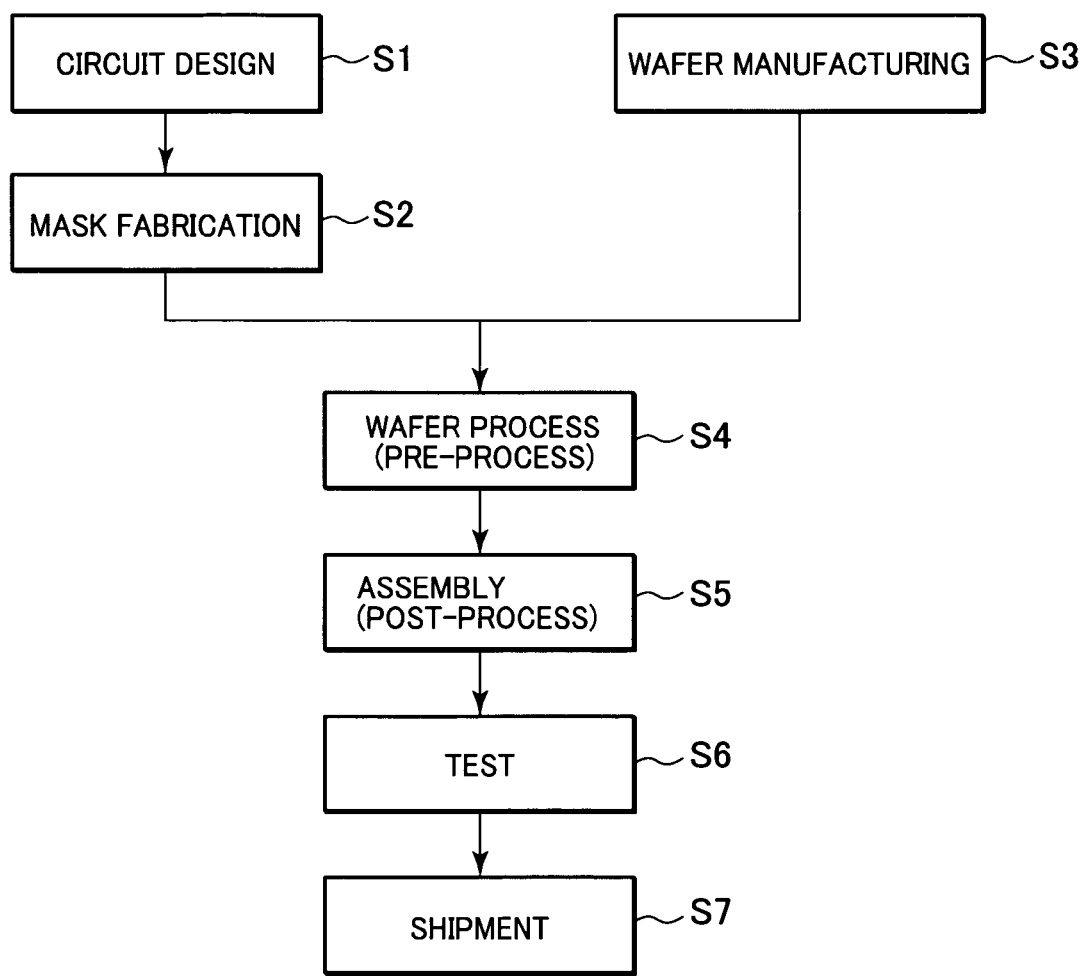
FIG. 7 is a diagram showing a device manufacturing process.

The following describes a manufacturing process of a semiconductor device using the above exposure apparatus. Referring to FIG. 7, there is shown a flow of an entire manufacturing process of the semiconductor device. In step 1 (circuit design), a circuit of the semiconductor device is designed. In step 2 (mask fabrication), a mask is fabricated on the basis of the designed circuit pattern.

On the other hand, in step 3 (wafer manufacturing), a wafer is manufactured using a material such as silicon. In step 4 (wafer process), which is referred to as a pre-process, the foregoing exposure apparatus forms an actual circuit on the wafer by lithography using the mask and wafer stated above. In the next step 5 (assembly), which is referred to as a post-process, a semiconductor chip is formed from the wafer fabricated in step 4. Step 5 includes assembly (dicing and bonding), packaging (chip encapsulation), and the like. In step 6 (test), the semiconductor device manufactured in step 5 is subjected to an operation check, durability test, and other tests. The semiconductor device completed by these processes is delivered in step 7.

The wafer process in step 4 includes the following: an oxidization step of oxidizing a surface of the wafer; a CVD step of forming an insulation film on the wafer surface; an electrode formation step of forming electrodes on the wafer by vapor deposition; an ion implantation step of implanting ions on the wafer; a resist process step of applying a photosensitive agent to the wafer; an exposure step of transferring the circuit pattern to the wafer, which has completed the resist process, using the exposure apparatus; a developing step of developing the wafer exposed in the exposure step; an etching step of removing portions other than the resist image developed in the developing step; and a resist removing step of removing the resist which has become unnecessary after the etching. By repeating these steps, a multiple circuit pattern is formed on the wafer.

By carrying out an exposure using the exposure apparatus according to the third embodiment in the device manufacturing process, devices can be manufactured with a high precision or a high throughput, thereby enabling manufacturing of fine and/or inexpensive devices.

While the present invention has been described with reference to exemplary embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

This application claims priority from Japanese Patent Application No.2004-056225 filed Mar. 1, 2004, which is hereby incorporated by reference herein.

What is claimed is:

1. A positioning apparatus, comprising:
   a first stage;
   a first moving mechanism to move said first stage in a predetermined direction;
   a second stage movable relative to said first stage;
   a second moving mechanism to move said second stage with a smaller stroke than that of said first stage;
   at least two magnetic plates disposed on opposite sides of said second stage in the predetermined direction; and
   at least two pairs of electromagnets each having a coil and a core member disposed on said first stage,
   wherein each pair of electromagnets is arranged to sandwich one of said at least two magnetic plates in the predetermined direction in a non-contact manner.

2. A positioning apparatus according to claim 1, wherein said at least two pairs of electromagnets generate forces when said first stage moves with an acceleration or a deceleration in the predetermined direction.

3. A positioning apparatus according to claim 1, said apparatus further comprising:
   deformation detecting means for detecting a magnitude of deformation of said second stage,
   wherein said at least two pairs of electromagnets are controlled on the basis of an output from said deformation detecting means.

4. A positioning apparatus according to claim 1, said apparatus further comprising:
   displacement detecting means for detecting a displacement of a substrate mounted on said second stage relative to said second stage,
   wherein said at least two pairs of electromagnets are controlled on the basis of an output from said displacement detecting means.

5. A positioning apparatus according to claim 1, wherein said apparatus includes:
   four magnetic plates disposed on lateral sides of said second stage; and
   four pair of electromagnets having coil and core member disposed on said first stage,
   wherein each pair of electromagnets is arranged to sandwich one of said four magnetic plates in the predetermined direction in a non-contact manner.

6. A positioning apparatus according to claim 1, wherein said second moving mechanism includes a linear motor for driving said second stage in a non-contact manner with said first stage.

7. A positioning apparatus according to claim 1, wherein one pair of electromagnets applies a pulling force to said second stage while the other pair of electromagnets applies a pushing force to said second stage.

8. An exposure apparatus for transferring a pattern of an original plate to a substrate, wherein the original plate or the substrate is positioned using the positioning apparatus according to claim 1.

9. A device manufacturing method, comprising the steps of:
   transferring or plotting a pattern to or on a substrate coated with a photosensitive agent by means of the exposure apparatus according to claim 8; and
   developing the substrate.

10. A positioning apparatus, comprising:
    a first stage movable in a first direction and a second direction opposite to the first direction;
    a first moving mechanism to move said first stage;
    a second stage movable relative to said first stage;
    a second moving mechanism to move said second stage with a smaller stroke than that of said first stage; and
    first and second couplings, which are disposed on opposite sides of said second stage, for transmitting forces from said first stage to said second stage,
    wherein said first coupling applies a pulling force to said second stage and said second coupling applies a pushing force to said second stage during acceleration of said first stage in the first direction, and said second coupling applies a pulling force to said second stage and said first coupling applies a pushing force to said first stage during acceleration of said first stage in the second direction.

11. An exposure apparatus for transferring a pattern of an original plate to a substrate, wherein the original plate or the substrate is positioned using the positioning apparatus according to claim 10.

12. A device manufacturing method, comprising the steps of:
    transferring or plotting a pattern to or on a substrate coated with a photosensitive agent by means of the exposure apparatus according to claim 11; and
    developing the substrate.

13. A positioning apparatus, comprising:
    a first stage;
    a first moving mechanism to move said first stage;
    a second stage movable relative to said first stage;
    a second moving mechanism to move said second stage with a smaller stroke than that of said first stage; and
    at least two couplings for transmitting forces from said first stage to said second stage, each of said at least two couplings comprising two coils, the transmitting forces being provided by said at least two couplings in a direction perpendicular to a side of said second stage to which said at least two couplings are adjacent,
    wherein, during acceleration and deceleration of said first stage, said couplings apply the transmitting forces in the same direction from two sides of said second stage in front and at the rear of the direction of the acceleration and deceleration.

* * * * *

UNITED STATES PATENT AND TRADEMARK OFFICE
CERTIFICATE OF CORRECTION

PATENT NO. : 7,333,180 B2  Page 1 of 1
APPLICATION NO. : 11/056287
DATED : February 19, 2008
INVENTOR(S) : Hideo Tanaka It is certified that error appears in the above-identified patent and that said Letters Patent is hereby corrected as shown below:

COLUMN 2:
  Line 58, "maimer" should read -- manner --.
  Line 67, "matter." should read -- matters. --.

COLUMN 3:
  Line 2, "inter ferometer 11." should read -- interferometer 11. --.

COLUMN 7:
  Line 20, "pair" should read -- pairs -- and "member" should read -- members --.

Signed and Sealed this

Twenty-sixth Day of August, 2008

JON W. DUDAS
*Director of the United States Patent and Trademark Office*